(12) United States Patent
Ritzenthaler (10) Patent No.: US 10,988,860 B2
(45) Date of Patent: Apr. 27, 2021

(54) METHOD FOR MANIPULATING CRYSTAL MORPHOLOGY TO ACHIEVE STABLE FLUIDIZATION

(71) Applicant: American Electric Power Company, Inc., Columbus, OH (US)

(72) Inventor: Douglas Ritzenthaler, Columbus, OH (US)

(73) Assignee: American Electric Power Company, Inc., Columbus, OH (US)

( * ) Notice: Subject to any disclaimer, the term of this patent is extended or adjusted under 35 U.S.C. 154(b) by 1 day.

(21) Appl. No.: 16/421,575

(22) Filed: May 24, 2019

(65) Prior Publication Data

US 2019/0368072 A1 Dec. 5, 2019

Related U.S. Application Data

(60) Provisional application No. 62/679,428, filed on Jun. 1, 2018.

(51) Int. Cl.
| | |
|---|---|
| *C30B 1/00* | (2006.01) |
| *C30B 33/02* | (2006.01) |
| *C30B 29/46* | (2006.01) |
| *B01D 53/83* | (2006.01) |

(52) U.S. Cl.
CPC .............. *C30B 33/02* (2013.01); *C30B 29/46* (2013.01); *B01D 53/83* (2013.01); *B01D 2251/304* (2013.01); *B01D 2251/606* (2013.01); *B01D 2257/302* (2013.01)

(58) Field of Classification Search
CPC .............. C30B 1/00; C30B 1/02; C30B 1/023
See application file for complete search history.

(56) References Cited

U.S. PATENT DOCUMENTS

| | | | | |
|---|---|---|---|---|
| 4,469,710 A | * | 9/1984 | Rielley | .................... A23D 9/00 426/417 |
| 6,267,789 B1 | * | 7/2001 | Ninane | .................... C01D 3/08 23/298 |
| 7,696,991 B2 | | 4/2010 | Higashi | |

* cited by examiner

*Primary Examiner* — Robert M Kunemund
(74) *Attorney, Agent, or Firm* — Julie E. Sanders; Anthony J. Swaneck (57) ABSTRACT

This disclosure provides an apparatus and method for improving the flowability of a powder by manipulating its crystal morphology. For example, a method and apparatus for achieving stable fluidization of a powder contained in a vessel.

9 Claims, 11 Drawing Sheets

METHOD FOR MANIPULATING CRYSTAL MORPHOLOGY TO ACHIEVE STABLE FLUIDIZATION

CROSS-REFERENCE TO RELATED APPLICATION

This application claims the benefit of priority of U.S. Provisional Application Ser. No. 62/679,428, filed Jun. 1, 2018. The disclosures of the prior application are considered part of (and are incorporated by reference in) the disclosure of this application.

BACKGROUND OF THE INVENTION

1. Field of the Invention

The present disclosure relates to material handling, more particularly, to improving the fluidization (flow) of a material, providing advantages in functionality, simplicity and engineering, operation, maintenance, and life cycle cost. The invention can be utilized in a dry scrubber system utilizing Dry Sorbent Injection (DSI). However, the invention is not limited to this application.

2. Description of the Related Art

It is well known among those who work in the area of material handling that material containing a high percentage of solids can be difficult to remove from a storage vessel. The foremost view in the art is that a high unconfined yield strength is primarily responsible for flow issues in storage vessels, for example arching, rat-holing, and bridging.[1] Unconfined yield strength is the major requisite stress to cause a group of particles to "yield," which results in shear movement of the bulk material (this is related to resistance to flow).[2]

[1] Johanson, Kerry, Effect of particle shape on unconfined yield strength, Powder Technology, Vol. 194, 2009, 246-251, Elsevier B. V.
[2] Johanson, Kerry, Effect of particle shape on unconfined yield strength, Powder Technology, Vol. 194, 2009, 246-251, Elsevier B. V.

A further leading view is that any moisture in the material will tend to congregate at the contact points between soluble particles, causing a portion of the particles to dissolve.[3] If the temperature then increases, the theory is, this moisture between particles evaporates, leaving solid salt bridges between adjacent particles. These salt bridges increase the adhesive force on the particles and therefore the unconfined yield strength as well, impeding fluidization. Therefore, the theory is, as temperature increases, flowability deteriorates.

[3] Johanson, Kerry, Powder Pointers, Summer 2018 Volume 12 No B, Material Flow Solutions, Inc, 1-2, Gainesville, Fla.

BRIEF SUMMARY OF THE INVENTION

It is an object of this disclosure to describe the experimentation which illuminated that the crystal structure of a material impacts fluidization, resulting in improved flowability at higher temperatures despite the common belief otherwise. It is an object of the present invention to provide a system and method for achieving stable fluidization of a powder comprising materials, such as sodium sulfate, with crystal morphology that can be manipulated with temperature.

DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE INVENTION

It is well known among those who work in the area of material handling that material containing a high percentage of solids can be difficult to remove from a storage vessel. The foremost view in the art is that a high unconfined yield strength is primarily responsible for flow issues in storage vessels.[4]

[4] Johanson, Kerry, Powder Pointers, Summer 2018 Volume 12 No B, Material Flow Solutions, Inc, 1-2, Gainesville, Fla.

A further leading view is that any moisture in the material will tend to congregate at the contact points between particles, causing the portion of the soluble particles near these contact points to dissolve.[5] The leading theory is that if temperature is increased, this moisture between particles evaporates, leaving solid salt bridges between adjacent particles. These salt bridges increase the adhesive force on the particles and therefore the unconfined yield strength as well, impeding powder flow. Therefore, the theory is, as temperature increases, flowability deteriorates.

[5] Johanson, Kerry, Powder Pointers, Summer 2018 Volume 12 No B, Material Flow Solutions, Inc, 1-2, Gainesville, Fla.

Despite the view among prominent members in the art to the contrary, both laboratory and field testing indicate that material flow problems are not necessarily due to moles of hydration or free water, and do not necessarily increase with temperature. Rather, the crystalline structure of a compound influences powder flowability.

For example, the crystal morphology (otherwise known as crystal structure) of anhydrous sodium sulfate at ordinary temperatures (below about 100 degrees C.) is an orthorhombic pyramidal crystal with twinning planes.[6] A twin is defined as a composite crystal built from two or more crystal specimens that are grown together in a specific manner so that there is at least one plane and a direction perpendicular to it that are related in the same manner to the crystallographic axes of both parts of the twin.[7] But at temperatures greater than and equal to about 100 degrees C. (212 degrees F.), the crystal shape changes to a monoclinic crystal (without twinning) and then at about 250 degrees C. (482 degrees F.) to hexagonal crystals (without twinning).[8] The lack of twinning in the crystal morphology results in the achievement of stable fluidization at and beyond about 100 degrees C., versus the failure to achieve stable fluidization, or even fluidization, below about 100 degrees C. Twinned crystals experience a greater unconfined yield strength because of the physical interlocking that occurs between particles due to the shape of the twinned crystals. It has been shown that particle shape as well as the number of contact points per adjacent particle affect unconfined yield strength and therefore flowability.[9]

[6]The Columbia Encyclopedia, 2000, 2646, 6th Edition, Gale Group, U.S.
[7]Glusker, Jenny P, Trueblood, Kenneth N., Crystal Structure Analysis: A Primer, 1985, 240, Oxford University Press, New York.
[8]The Columbia Encyclopedia, 2000, 2646, 6th Edition, Gale Group, U.S.
[9]Johanson, Kerry, Effect of particle shape on unconfined yield strength, Powder Technology, Vol. 194, 2009, 246-251, Elsevier B. V.

Experimental Methods

Contrary to the popular belief that flowability deteriorates with increasing temperature, experimental data showed that flowability improved at higher temperatures, even to the point of achieving stable of fluidization. Fluidization is readily determined via a visual inspection of a column of material aerated with air. The air flow is measured and recorded, from which air velocities are calculated. The temperature of heated air is measured with a thermocouple or other temperature measuring device. If unheated, the air is assumed to be at ambient temperature, near 25 degrees C. (77 degrees F.).

If the column of material forms fissures (small, visible tunnels through the material) that provide a multitude of visible conduits for the air to pass through the material and relieve the built up pressure beneath the material, then the material is said to be experiencing fissures, or channeling, and has not reached fluidization.[10][11]

[10]Cocco, R. et. al., Introduction to Fluidization, November 2014, 21-29, American Institute of Chemical Engineers Journal, U.S.
[11]Vasconcelos, P. S., Amarante Mesquita, A. L., Minimum and Full Fluidization Velocity for Alumina Used in the Aluminum Smelter, November 2011, 8-13, Volume 3 No. 4, International Journal of Engineering Business Management, Intech Open Access Publisher.

Alternatively, if the column of material allows distinct volumes of air to be relieved periodically and in an uneven manner, the material is said to be experiencing bubbling flow, and it is not consistently fluidized.[12][13]

[12]Cocco, R. et. al., Introduction to Fluidization, November 2014, 21-29, American Institute of Chemical Engineers Journal, U.S.
[13]Vasconcelos, P. S., Amarante Mesquita, A. L., Minimum and Full Fluidization Velocity for Alumina Used in the Aluminum Smelter, November 2011, 8-13, Volume 3 No. 4, International Journal of Engineering Business Management, Intech Open Access Publisher.

However, if air passes uniformly through the material causing the material to uniformly expand and behave in a fluid-like manner, the material is said to have achieved stable fluidization.[14][15]

[14]Cocco, R. et. al., Introduction to Fluidization, November 2014, 21-29, American Institute of Chemical Engineers Journal, U.S.
[15]Vasconcelos, P. S., Amarante Mesquita, A. L., Minimum and Full Fluidization Velocity for Alumina Used in the Aluminum Smelter, November 2011, 8-13, Volume 3 No. 4, International Journal of Engineering Business Management, Intech Open Access Publisher.

The experiment comprised a vessel with sufficient sodium sulfate powder to form a bed of material within the vessel. The vessel was configured to allow air, either heated or unheated, to be introduced below the material. The temperature of the ambient air was recorded at 25 degrees C. (77 degrees F.). This is assumed to be the approximate temperature of the desiccated aeration air and thus of the sodium sulfate powder when unheated.

First, at ambient temperature, flow (pressure) was increased until fissures were observed through the material to the surface, relieving itself into the room. Pressure was increased gradually until the flow rate of the desiccated air was more than twenty times what is typically needed for fluidization. The material gradually transitioned into bubbling flow, but fluidization was never achieved.

The test apparatus was then modified for higher temperatures. Desiccated air at no less than 107 degrees C. (225 degrees F.) was introduced into the now insulated apparatus to prompt aeration. The desiccated air was permitted to run overnight prior to visual observation to ensure that the apparatus itself, as well as the powder in the apparatus, were sufficiently heated above the transition temperature. The material was observed to be stably fluidized though observation points cut into the insulation.

To confirm fluidization, the desiccated aeration air was briefly terminated, upon which the column of material dropped slowly to a lesser volume. Once this contraction was complete and the desiccated aeration air again initiated, the material uniformly increased in volume and the desiccated aeration air passed through the material with no visible fissures, channels, or bubbling. The material achieved stable fluidization. The test was continued by allowing the material to cool below about 100 degrees C., and fluidization was lost. Only the temperature of the desiccated air was changed, meaning the fluidization that occurred above 100 degrees C. and which ceased below that temperature could not have been due to another variable such as moisture. Likewise, upon reheating to about 107 degrees C. (225 degrees F.), fluidization was again achieved.

The ultimate fluidization test was conducted in the field. The field setup was similar to that in the lab except the silo was not insulated due to the sufficient outside temperature, and the source of air in the field was ambient air versus desiccated air in the lab. The temperature of the gas stream reached 225 degrees F. (about 107 degrees C.) for a period of several days. Stable fluidization under these conditions was achieved, as evidenced by the silo being readily emptied.

Figure 1:
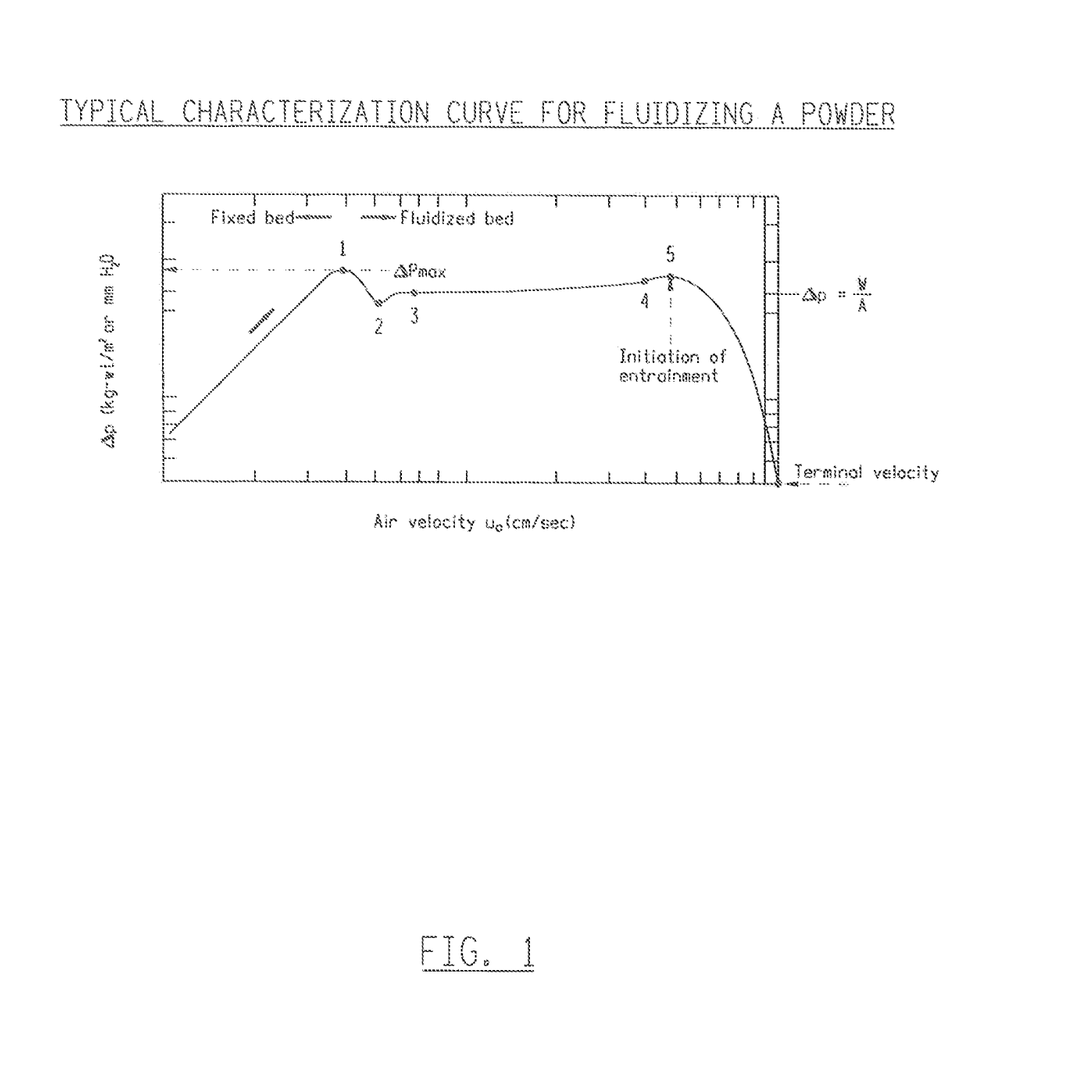
FIG. 1 shows a typical fluidization profile used to determine air flow (pressure) requirements for fluidizing particles.

The amount of air required for fluidization is dependent on the material. A typical fluidization profile is depicted in FIG. 1.[16] Fluidization of a powder is achieved when the powder volume increases uniformly and the resultant powder flow characteristics approach that of a fluid. This point, fluidization, is identified as the "Minimum Fluidization Velocity" (1). As velocity increases further, there is a distinct reduction in the pressure drop ($\Delta p$) across the powder (2), and then as the velocity increases further, pressure drop ($\Delta p$) becomes stable at the minimum operating velocity (3). Minimum operating velocity (3), or stable fluidization, is judged to be reached where perturbations in air flow or back pressure avoid significant changes in pressure drops and thus do not impact the overall fluidization of the bulk powder. The maximum operating velocity (4) must be low enough to avoid the velocity where entrainment occurs (5). The operating velocity range for stable fluidization must be great enough to reach the point at which the pressure drop decreases and becomes stable (3), and less than the velocity which induces entrainment (5).

[16]Kunii, Daizo and Levenspiel, Octave, Fluidization Engineering, 1969, 74, John Wiley & Sons, Inc., U.S.

In the experimentation completed, the minimum operating velocity and volume for stable fluidization was calculated to be sufficient to achieve proper fluidization. The specific values are proprietary, but the velocity and flow rate applied were four times the calculated value. Despite vastly exceeding the calculated volume of air introduced to the powder bed via the aeration device according to the above methodology, the material never achieved fluidization at temperatures below about 100 degrees C.

During laboratory testing above the aforementioned transition temperature of about 100 degrees C. (212 degrees F.), stable fluidization was achieved at velocities and flow rates very close to the calculated values, disproving the common belief in the art that the unconfined yield strength, and therefore flow issues as well, of soluble powders such as sodium sulfate increase with temperature.

Figure 2:
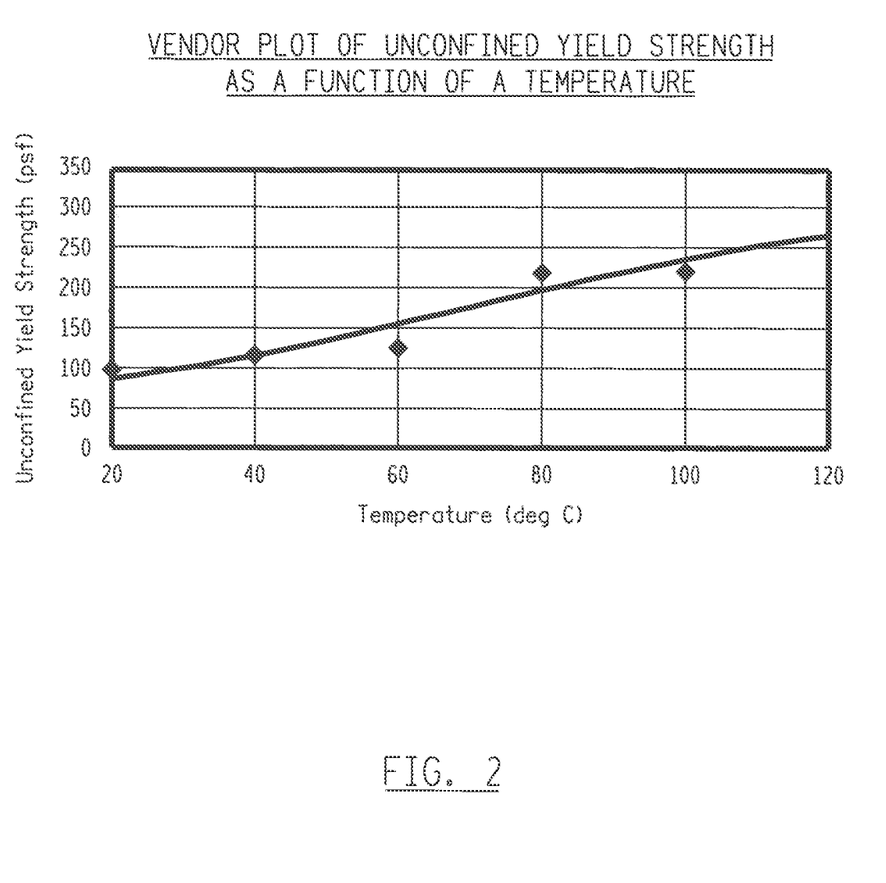
FIG. 2 shows experimental data, unconfined yield strength as a function of temperature.

FIG. 2 shows a trend line of unconfined yield strength versus temperature applied to experimental data, illustrating the common view in the art that unconfined yield strength increases with temperature. This indicates the expectation that unconfined yield strength would increase beyond 100 degrees C. and therefore flowability would continue to deteriorate.

Contrary to this common view, the lab data showed fluidization occurred beyond about 100 degrees C., therefore unconfined yield strength must dramatically drop. Note that no data was collected above 100 degrees C. (212 degrees F.), yet the trend line from the data extends beyond 100 degrees C. Those knowledgeable in the art who created the graph assumed the relationship was linear, and extended the trend line beyond 100 degrees C. However, as this disclosure elucidates, lower unconfined yield strength and therefore less flow issues, not a higher unconfined yield strength and more flow issues, are present beyond 100 degrees C., and an accurate graph would show a negative slope beyond 100 degrees C.

Based on this trend line, the temperatures in the field were reduced from their initial temperatures of about 93 degrees C. (about 200 degrees F.) to about 71 degrees C. (160 degrees F.). There were no measureable improvements to the flow of the material out of the silo despite this reduction in temperature.

Additionally, an analysis was completed of the moisture content of the silo powder at various temperatures to determine if the loss in moisture at 100 degrees C. (212 degrees F.) is the reason for its ability to fluidize. This analysis disproved the theory that flow improved to the point of allowing stable fluidization because of the loss of free water from the sodium sulfate powder. In fact, moisture data indicates that most of the free moisture is liberated at temperatures below 100 C (212 F), pointing to an alternate cause for the dramatic change in flow characteristics of sodium sulfate powder above 100 degrees C. compared to below 100 degrees C.

Figure 3:
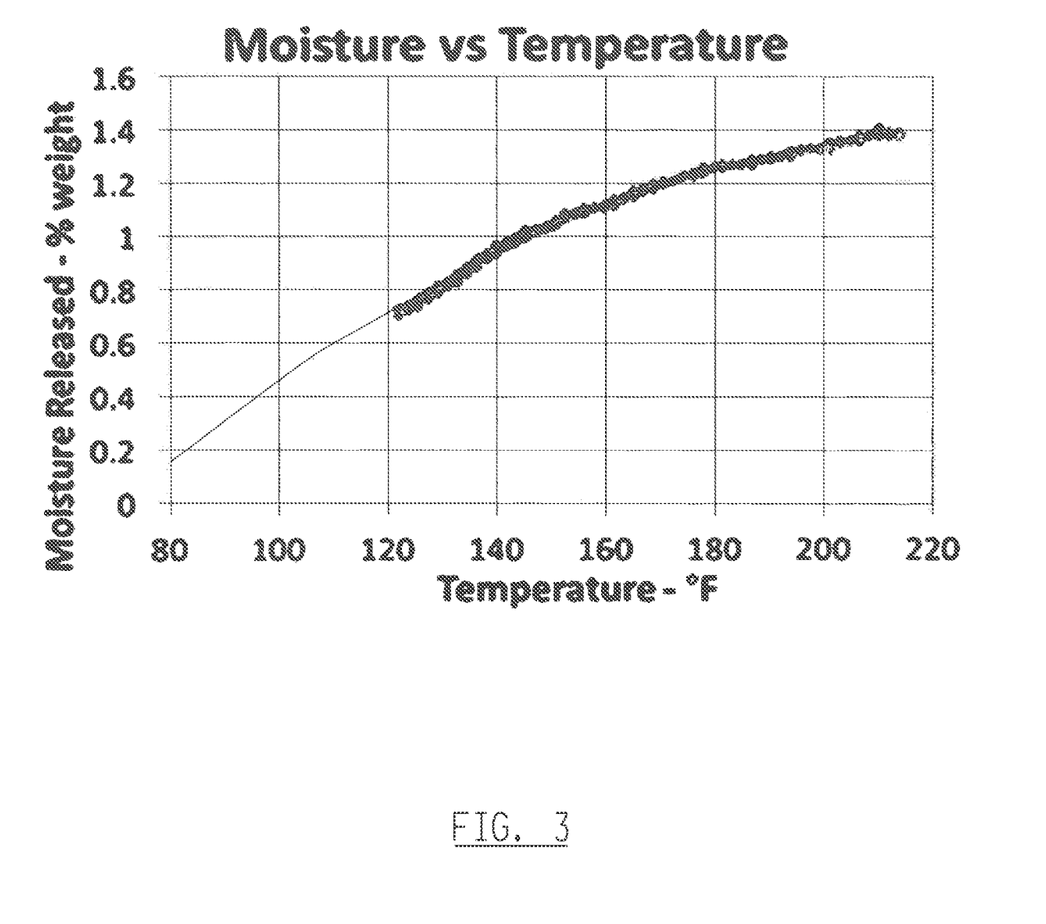
FIG. 3 shows moisture vs. temperature experimental data.

FIG. 3 presents the released moisture from a powder sample as a function of temperature in light of the above. Note that the powder was tested at temperatures of up to about 215 degrees F. (102 degrees C.). It shows no dramatic change in moisture released at the transition temperature of 212 degrees F., meaning moisture content is not determinative.

Figure 4:
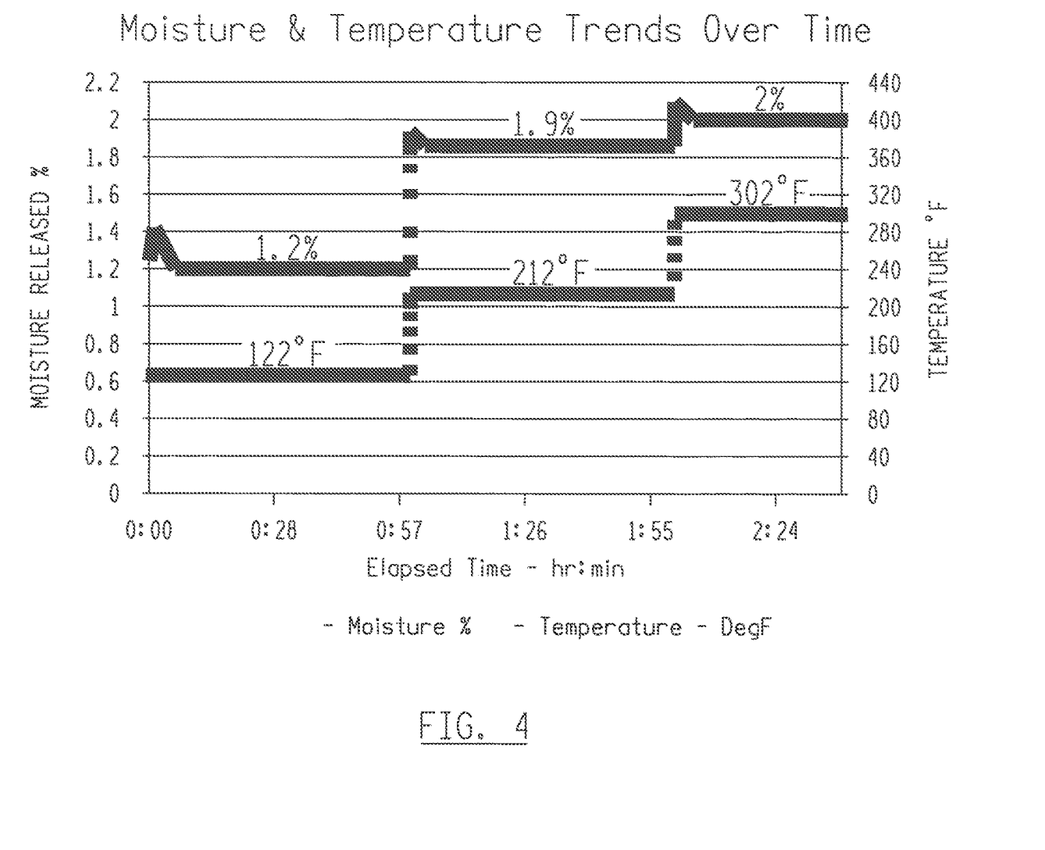
FIG. 4 shows additional moisture and temperature experimental data over time.

Similarly, FIG. 4 presents the relationship of moisture released as a function of both powder temperature and elapsed time. At 50 degrees C. (122 degrees F.), the moisture released is 1.2% by weight (mass). When this temperature is raised to 100 degrees C. (212 degrees F.), the moisture release increases from 1.2% to 1.9%, for a net increase of 0.7%. When the transition temperature is exceeded at the third point, 150 degrees C. (302 degrees F.), the moisture released increases from 1.9% to 2.0% for a net increase of 0.10% moisture. It is interesting to note that when the transition temperature of 100 degrees C. (212 degrees F.) is exceeded, the increase in moisture release is only 0.10%. This should be juxtaposed with the 0.7% increase from 50 to 100 degrees C. (where no transition temperature was exceeded) or the 1.2% increase from ambient temperature to 50 degrees C. This lack of dramatic change, hardly any in fact, suggests that moisture content in the powder is not the primary reason for the inability to fluidize. Desiccation of the aeration air minimized the chances of introducing additional moisture into the test apparatus or sodium sulfate powder. The above results eliminate moisture in the sodium sulfate powder as a major contributing factor to the fluidization of the powder.

Although the theoretical transition temperature is 100 degrees C. (212 degrees F.), it should be understood that due to, for example the impurities in the mixture, the exact point of transition may be slightly different than the published value. Nonetheless, it is interesting to note that there is no dramatic increase, only a net increase of 0.10%, in measured moisture release when crossing the transition temperature of 100 degrees C. (212 degrees F.).

Figure 5:
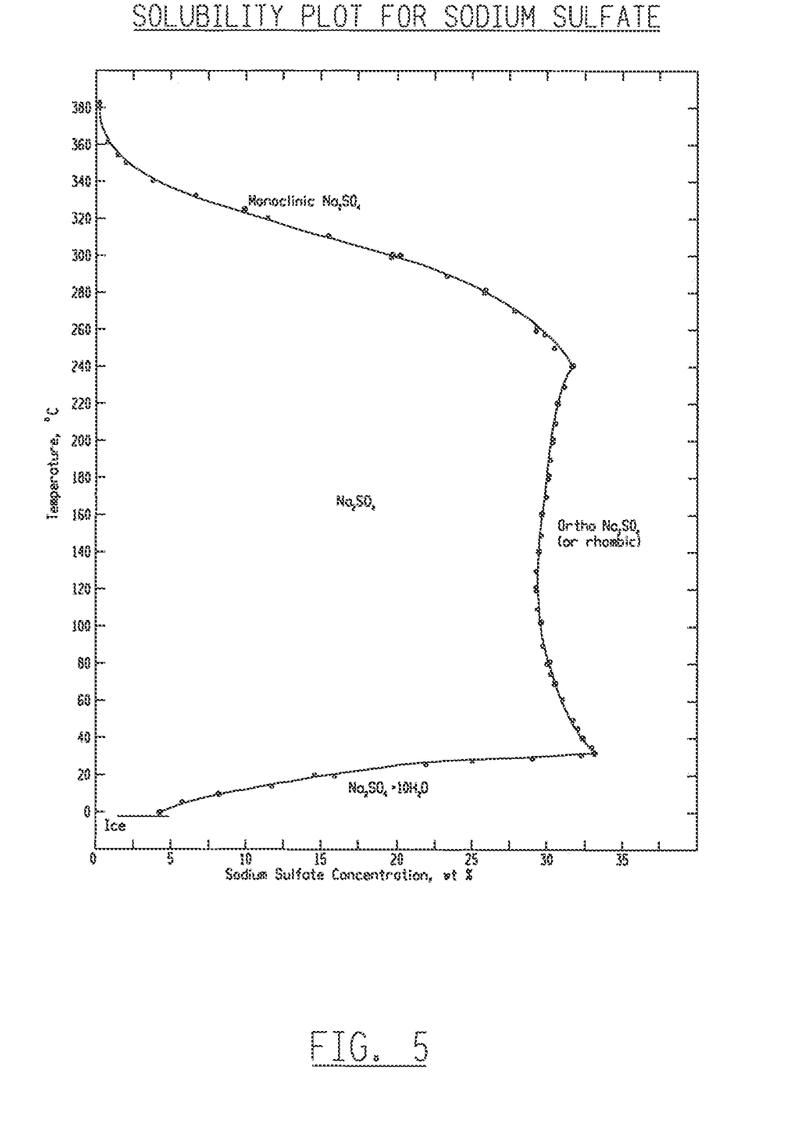
FIG. 5 shows a solubility curve of sodium sulfate in solution.

Considering the crystal structure of sodium sulfate, as well as its chemical transition temperature, sheds further light on the lack of fluidization below the aforementioned transition temperature. Sodium sulfate has a low-end chemical transition temperature of about 32 degrees C. (90 degrees F.),[17] as shown in FIG. 5.[18] FIG. 5 shows sodium sulfate in solution, illustrating that a chemical change occurs with temperature (the morphology transition temperatures were approximated as they were not yet established).

[17]Dickinson, H. C.; Mueller, E. F., The transition temperature of sodium sulfate referred anew to the international standard, 1907, 1381, 29 Journal of the American Chemical Society.
[18]Garrett, Donald E., Sodium Sulfate: Handbook of Deposits, Processing, Properties, and Use, 2001, 346, Academic Press, U.S.

At room temperature, sodium sulfate assumes an orthorhombic crystalline structure, while above about 100 degrees C. (212 degrees F.) it assumes a monoclinic structure, and above about 250 degrees C. (482 degrees F.) it assumes a hexagonal structure.[19] Other sources identify the crystalline structure at ambient temperatures to be orthorhombic[20] or orthorhombic pyramidal.[21]

[19]The Columbia Encyclopedia, 2000, 2646, 6th Edition, Gale Group, U.S.
[20]Wyckoff, R. W. G., The Structure of Crystals, Second Edition, 1935, 66, Reinhold Publishing Corporation, New York, U.S.
[21]Garrett, Donald E., Sodium Sulfate: Handbook of Deposits, Processing, Properties, and Use, 2001, 346, Academic Press, U.S.

Figure 6:
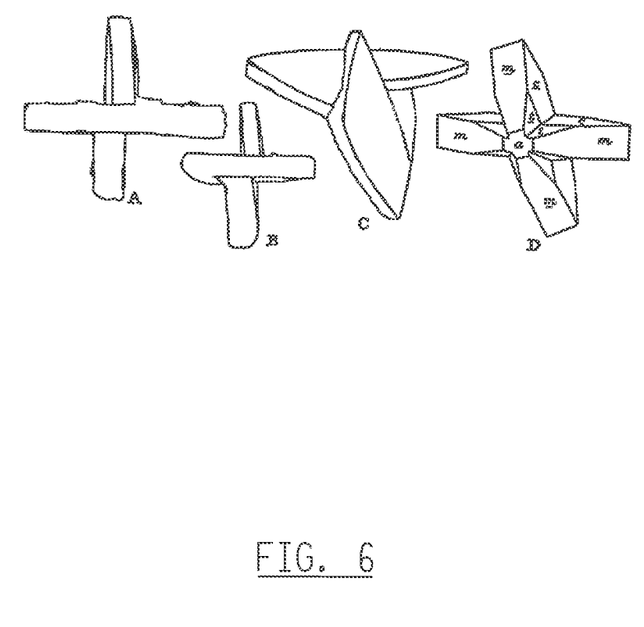
FIG. 6 shows an example of crystals with an orthorhombic morphology with twinning planes.
Figure 7:
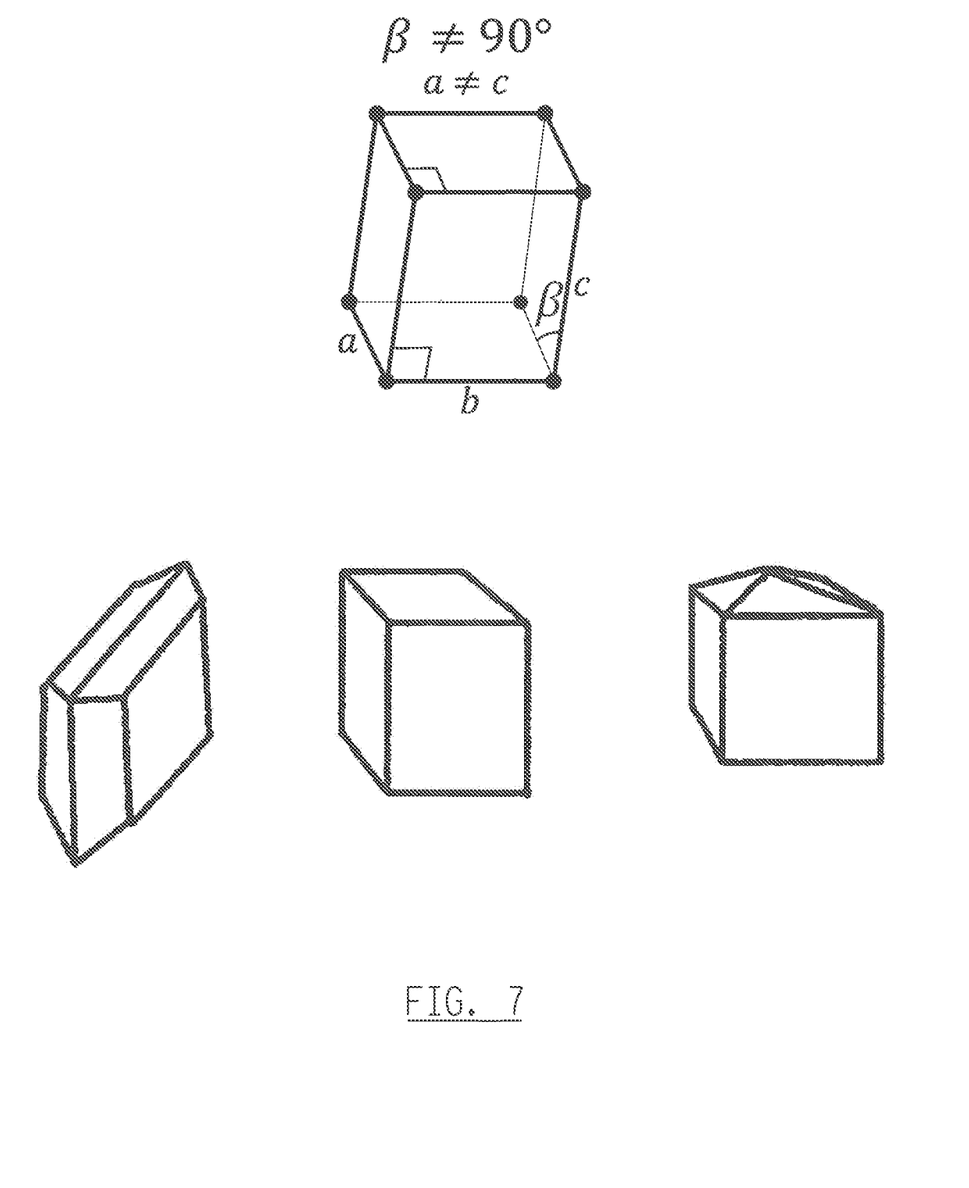
FIG. 7 shows an example of crystals with a monoclinic morphology, and no twinning planes.

A 1923 USGS report further describes sodium sulfate crystals at ambient temperature as orthorhombic crystals exhibiting twinning.[22] The crystalline structure for anhydrous sodium sulfate is an orthorhombic pyramidal crystal with twinning planes as shown in FIG. 6.[23] At 100 degrees C. (212 degrees F.) the crystal shape changes to a monoclinic crystal, shown in FIG. 7. A comparison of FIG. 6 and FIG. 7 illustrates that the morphology resulting from the twinning in the orthorhombic crystals makes it more difficult for the powder to achieve stable fluidization due the potential for the powder's twinning planes to interlock resulting in a higher yield strength of the powder.

[22]Wells, Roger C., Sodium Sulfate: Its Sources and Uses, Bulletin 717, Department of the Interior, United States Geological Survey, 2-3.
[23]Wells, Roger C., Sodium Sulfate: Its Sources and Uses, Bulletin 717, Department of the Interior, United States Geological Survey, 2-3.

Figure 8:
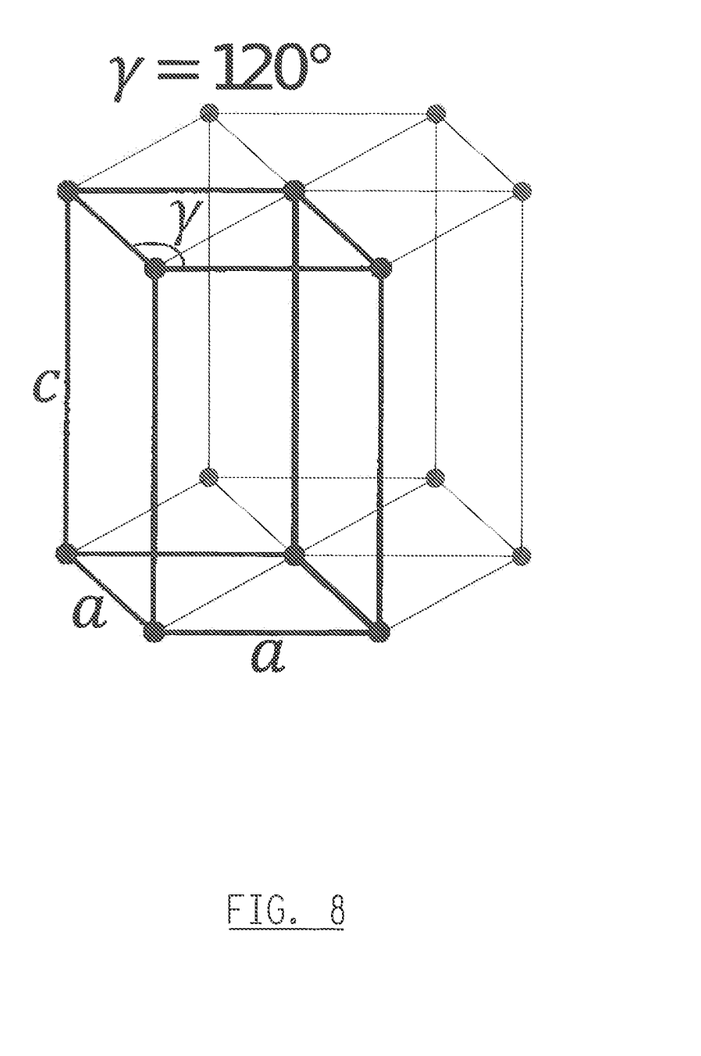
FIG. 8 shows an example of crystals with a hexagonal morphology, and no twinning planes.

The next aforementioned transition temperature is at 250 degrees C. (482 degrees F.), well above the temperature range relevant to this discussion.[24] However beginning at this transition, the morphology of sodium sulfate transforms to hexagonal crystals as shown in FIG. 8, without twinning, and thus fluidization can be achieved as with the monoclinic crystals.

[24]Wells, Roger C., Sodium Sulfate: Its Sources and Uses, Bulletin 717, Department of the Interior, United States Geological Survey, 2-3.

TABLE 1

Table of crystalline structure of anhydrous sodium sulfate at various transition temperatures

| Anhydrous Sodium Sulfate Temperatures | Crystalline Structure |
|---|---|
| Room Temperature, 21 degrees C. (70 degrees F.) | Orthorhombic Pyramidal Crystal with Twinning Planes |
| 100 degrees C. (212 degrees F.) | Monoclinic Crystal |
| 250 degrees C. (482 degrees F.) | Hexagonal Crystal |

X-ray diffraction (XRD) was performed on a sample of powder from the silo, but the results were not meaningful. Later, this failure to obtain meaningful XRD results was attributed to the presence of twinning crystals. XRD is unable to identify crystalline structures when twinning is present.[25] [26] This limitation on one of the primary methods to identify crystalline structures may explain why most sources fail to identify twinning as a common structure for sodium sulfate. In fact, some even recommend avoiding conducting an XRD on crystals exhibiting twinning, or to modify the crystal to exclude twinning.[27]

[25]Pickworth Glusker, J., Trueblood, K. N., Crystal Structure Analysis, A Primer, 1985, 191-194, Second Edition, Oxford University Press.
[26]U.S. Pat. No. 7,696,991B2, Apr. 13, 2010, Higashi, [0004].
[27]Glusker, Jenny P, Trueblood, Kenneth N., Crystal Structure Analysis: A Primer, 1985, 194, Oxford University Press, New York.

Invention Disclosed

Dry Sorbent Injection (DSI) is an example application of the disclosure herein. Though not part of the claimed invention, a discussion of DSI is included in this disclosure (FIG. 9) for clarity. DSI is a viable option for air quality control. It achieves mitigation of $SO_2$ and other acid gasses at relatively low capital costs, making it an attractive retrofit option. As this technology is implemented on a large (e.g. power plant) scale, flow issues can arise with the powder being collected.

Figure 9:
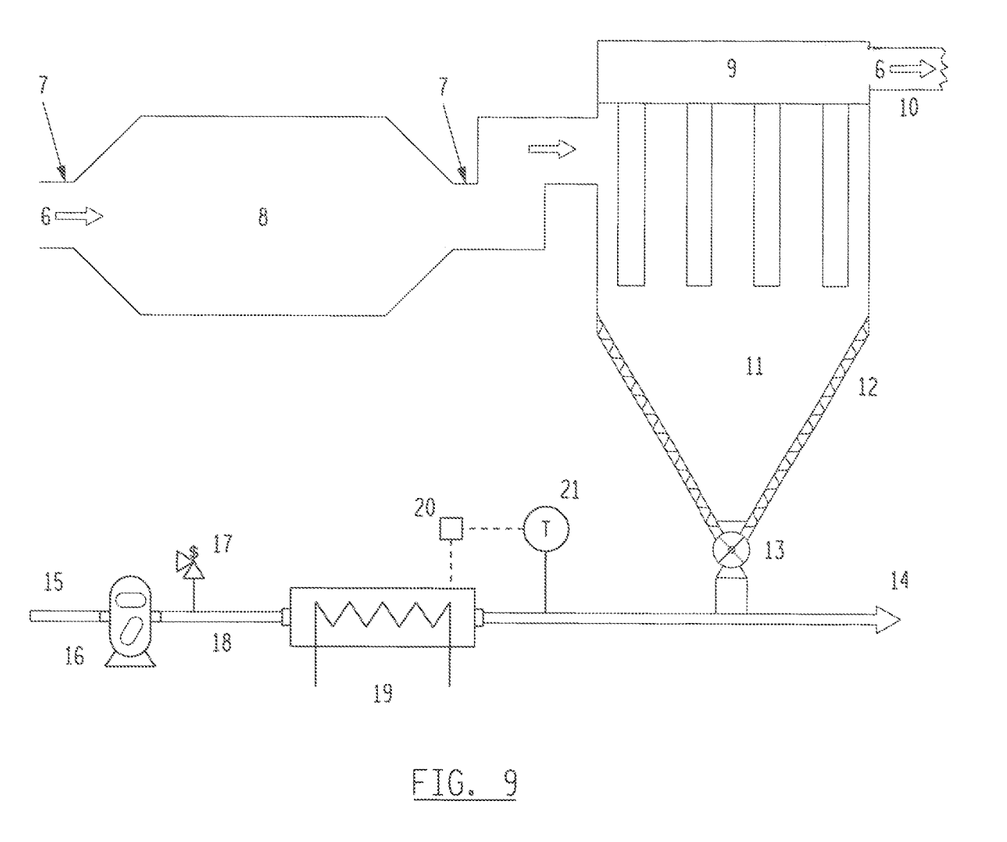
FIG. 9 shows an example embodiment of sodium sulfate collection and transport, representing an application of the present disclosure in relation to the use of Dry Sorbent Injection in a coal-fired power plant.

In DSI as shown in FIG. 9, sodium bicarbonate (SBC) (7) is injected in order to react with acid gasses such as $SO_2$, for example in a coal-fired power plant's flue gas (6), downstream or upstream of an optional electrostatic precipitator (8) and upstream of fabric bags in a pulse jet fabric filter (PJFF) (9) with hoppers (12) insulated as necessary. After injection, the SBC (7) calcines due to higher temperatures to make $Na_2CO_3$, and the $SO_2$ gas and $Na_2CO_3$ react to produce sodium sulfate as expressed in Equations 1 and 2, below.

$$2NaHCO_3 + Heat \rightarrow Na_2CO_3 + H_2O \text{ (g)} \qquad \text{Eq. 1}$$

$$Na_2CO_3 + SO_2 + \tfrac{1}{2}O_2 \rightarrow Na_2SO_4 + CO_2 \text{ (g)} \qquad \text{Eq. 2}$$

A powder (11) entrained in flue gas (6) is collected by fabric bags in PJFF (9), shed to insulated inverted pyramidal hoppers (12), and through an airlock (13) to a pneumatic conveying line of a heated gas stream (14), which can be of motive ambient air (15) and which is mobilized, for example with a blower (16). Pneumatic conveying line of heated gas stream (14) has a pressure relief valve (17) to eliminate any excess pressure, and is conveyed for example by a conduit (18), and heated with a temperature control means such as an electric heater (19). The temperature of the ambient air (15) is measured by a temperature sensor, for example a thermocouple (21), which is sent to a temperature control means (20), and this temperature is compared to a first set point temperature. If the temperature is lower than the first set point temperature, the temperature control means (20) sends a signal to energize heater (19), to heat the ambient air (15) to at least the first set point temperature.

Figure 10:
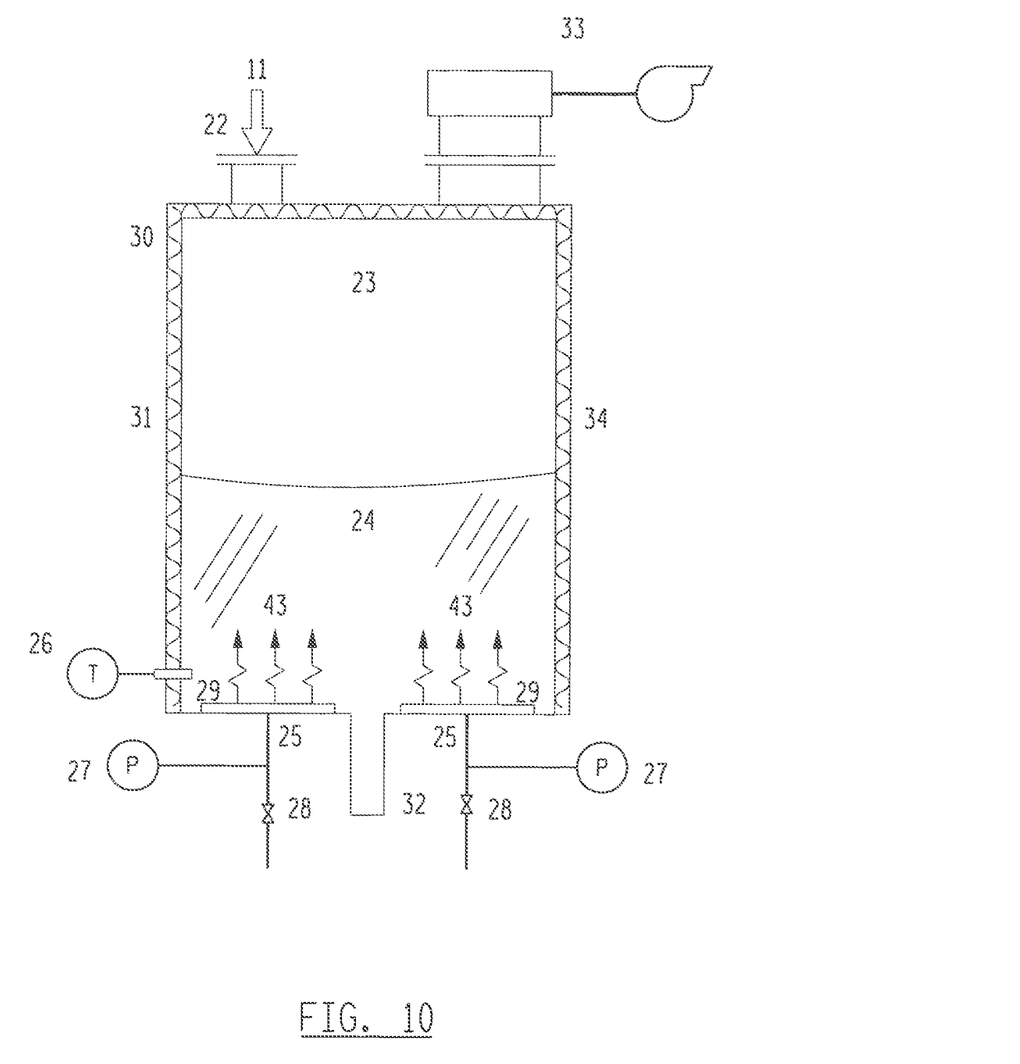
FIG. 10 shows a storage vessel, for example a silo, truck, trailer, or rail car, and the accompanying system for improving flowability and achieving stable fluidization according to an example embodiment of the present disclosure.

Pneumatic conveying line of a heated gas stream (14) pneumatically transports powder (11) to a vessel (34) as shown in FIG. 10. Flue gas (6) is exhausted at location (10), eventually to the environment.

Powder (11), used to illustrate the preferred embodiment is mainly sodium sulfate (greater than about 98%) combined with impurities, which are in the present disclosure as a small amount of fly ash (less than about 1%) and activated carbon (less than about 1%) depending on the amount of mercury in the fuel, but can be these materials in other amounts or other materials. An issue occurs when the silo will not discharge the powder effectively into a disposal container, for example, in the application of DSI. The present invention comprises an apparatus and method for manipulating crystal structure of a powder in order to achieve stable fluidization. Embodiments of the present invention will now be described in detail with reference to the drawings.

A preferred embodiment of the invention is shown in FIG. 10. FIG. 10 shows a storage vessel (34) such as a truck, trailer, rail car, or as in the present embodiment, a silo, and the accompanying system for achieving stable fluidization according to an example embodiment of the present disclosure.

Vessel (34) has a rigid exterior shell (30), and collects powder (11) for disposal, forming powder bed (24). The silo of the preferred embodiment has a flat bottom but the vessel is not limited to having a flat bottom. The disclosure herein allows for the achievement of stable fluidization in silos with flat bottoms, thereby avoiding the additional costs associated with silos with conical bottoms.

As shown in FIG. 10, vessel (34) has a rigid exterior shell (30) which can have insulation (31), has an inlet portal (22) through which powder (11) enters into an interior space (23) in the silo forming powder bed (24). Vessel (34) also comprises at least one atmospheric vent (33) which can be a bin vent filter with an optional exhaust fan, extending from interior space (23) through exterior shell of the vessel (30).

A gas stream (43) is introduced to interior space (23) of vessel (34) and powder bed (24) therein via at least one gas inlet connection (25) and an aeration device (29). Aeration device (29) can be, but is not limited to, air slides, pads, or pozzolanic stones. Aeration device (29) can further comprise a mesh, cloth, felt, or other fabric (woven or unwoven) that covers the air slides, pads, or other pozzolanic stones, and provides a medium to evenly distribute the heated air across the area of the air slides, pads, or stones and is designed for a uniform gas velocity determined to be sufficient for fluidization. Once fluidized, the powder exits the silo via an outlet portal (32).

Gas stream (43) heats powder bed (24). The temperature of powder bed (24) is measured by a temperature sensor (26), for example a thermocouple that in the preferred embodiment extends from the exterior of the vessel (30) to interior space (23). Powder bed (24) is heated to at least a first predetermined transition temperature, which in the present embodiment is about 100 degrees C. for sodium sulfate. This controls the crystal structure such that twinning is eliminated, and combined with the motive force imparted by gas stream (43) via aeration device (29), powder bed (24) achieves stable fluidization. Gas stream (43) exits via atmospheric vent (33) and powder (11), now fluidized, exits the vessel via an outlet portal (32).

Gas stream (43) is also pressurized and controlled by a pressure control device such as a control or throttling valve (28) to establish a gas stream flow rate sufficient to achieve initial fluidization of powder bed (24). A pressure indicator (27) (for example, a pressure gauge) may be used to determine when to adjust the air pressure to establish stable fluidization which is defined further in FIG. 1.

Figure 11:
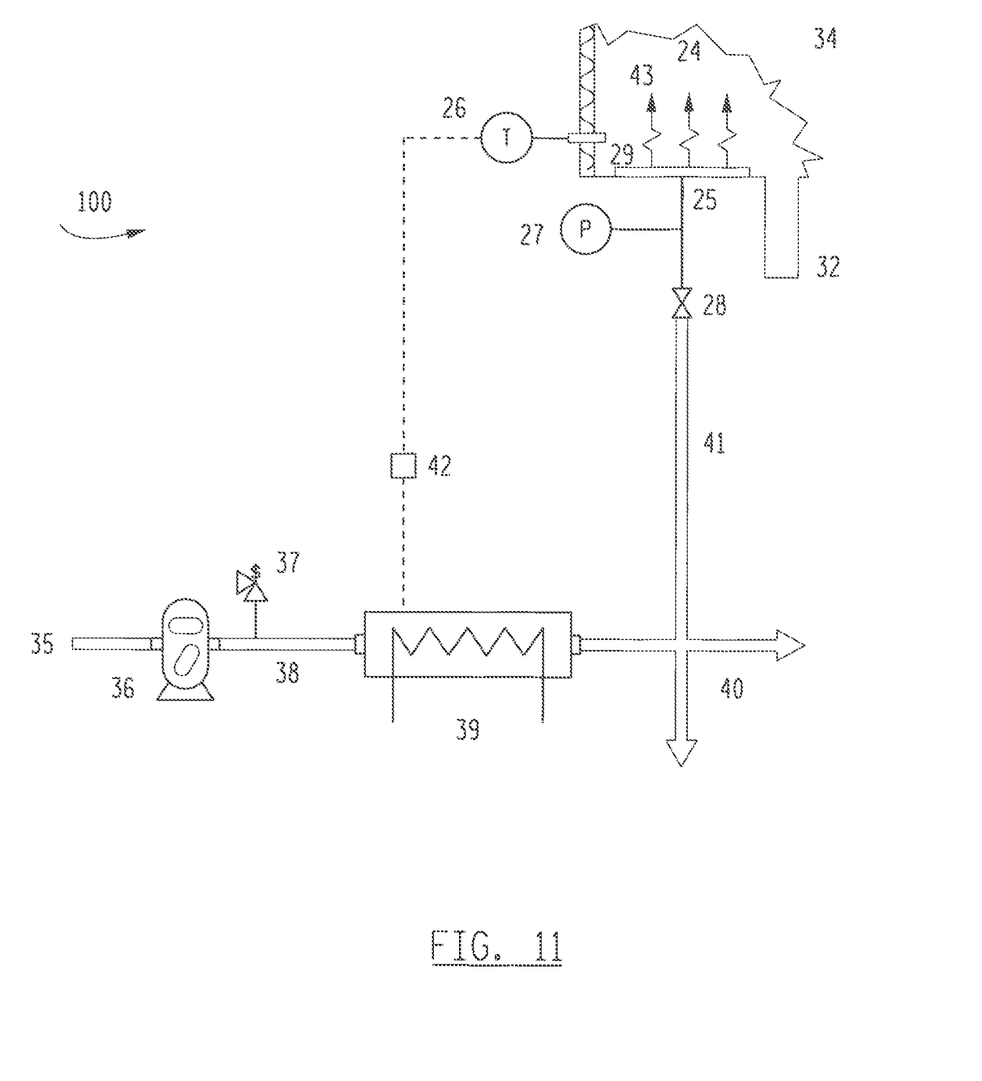
FIG. 11 shows a gas stream distribution system including an aeration device for improving flowability and achieving stable fluidization according to an example embodiment of the present disclosure.

The preferred embodiment shown in FIG. 11 utilizes gas stream distribution system (100). Gas stream (43) is controlled to maintain at least a first predetermined transition temperature selected so that the powder (11) lacks twinning.

A temperature sensor (26), for example a thermocouple, measures the temperature of powder bed (24). The temperature of powder bed (24) is sent to a temperature control means (42), and this temperature is compared to the first predetermined transition temperature. If the temperature of powder bed (24) is lower than the first predetermined transition temperature, temperature control means (42) sends a signal to energize a heating device (39) to heat gas stream (43) to at least the first predetermined transition temperature. Temperature sensor (26) can be located elsewhere in gas stream (43) as long as it is downstream of heating device (39).

As described above, gas stream (43) is also pressurized and controlled by pressure control device such as a control or throttling valve (28) to establish a gas stream flow rate sufficient to achieve initial fluidization of the powder bed. Pressure indicator (27) (for example, a pressure gauge) may be used to determine when to adjust the air pressure to establish stable fluidization, which is defined further in FIG. 1. A pressure relief valve (37) allows excess pressure to be released from the system.

The gas stream (43) must overcome a first resistance to the gas stream flow inherent in gas stream distribution system (100). It must also overcome a second resistance to gas flow resulting from the structure of powder bed (24), wherein after achieving initial fluidization of the powder bed, the flow rate of gas stream (43) is further adjusted to achieve stable fluidization of powder bed (24) without causing powder (11) to become entrained in gas stream (43).

Gas stream distribution system (100) further comprises heater (39) and mobilization means (36) such as a compressor or blower to mobilize ambient air (35), forming gas stream (43). Gas stream (43) is transported via a conduit such as a pipe, tube, or hose (38) to heater (39) and then to a manifold (40), where gas stream (43) is delivered via a pipe, tubing, hose, or other conduit (41), to at least one aeration device (29) and then introduced into powder bed (24).

The relative locations of the optional manifold (40) and heater (39) are insignificant, but the gas stream at the exit of aeration device (29) must be heated to at least the first predetermined transition temperature. The pressure control device (28) can be manual or automated. In this embodiment, the pressure control device (28) is manually adjusted to attain the desired pressure as indicated on the pressure indicator (27).

Several variations in the implementation of the present invention have been described. The specific arrangements and methods described here are illustrative of the principles of this invention. Those skilled in the art may make numerous modifications in form and detail without departing from the true spirit and scope of the invention. Although this invention has been shown in relation to a particular embodiment, it should not be considered so limited. Rather it is limited only by the appended claims.

What is claimed is:

1. A method for manipulating crystal structure to fluidize a powder comprising:
   collecting a powder comprising a crystal structure in a vessel wherein the vessel comprises an exterior wall and an interior volume and wherein the powder forms a powder bed within the interior volume;
   injecting a heated compressed gas into the vessel by way of one or more gas inlet ports; and
   agitating and heating the powder with the heated compressed gas to bring an average temperature of the powder to least a predetermined transition temperature, so as to transform the crystal structure of substantially all of the powder so that the crystal structure is transmuted to facilitate an improvement in flowability relative to the former crystal shape.

2. The method of claim 1, wherein the injecting a heated compressed gas step further comprises providing the heated compressed gas stream to at least one aeration device in contact with the powder bed, wherein the at least one aeration device is selected so as to evenly distribute the heated compressed gas stream throughout the powder bed.

3. The method of claim 1, wherein the injecting a heated compressed gas step further comprises pressurizing the heated compressed gas to a predetermined pressure by a gas handling system, the predetermined pressure selected so as to facilitate the fluidization of the powder bed.

4. The method of claim 1, further comprising controlling the temperature of the heated pressurized gas via a temperature control means comprising at least one temperature sensing device and having a means by which to control the temperature of the heated pressurized gas.

5. The method of claim 1, further comprising controlling the pressure of the gas stream via a pressure control means comprising at least one pressure sensing device located in contact with the heated pressurized gas and positioned upstream of the at least one gas inlet connection and having a means for varying the pressure of the heated pressurized gas stream prior to the gas inlet connection.

6. The method of claim 1, wherein the injecting a heated compressed gas step further comprises establishing a heated pressurized gas stream flow rate sufficient to achieve initial fluidization of the powder bed by overcoming a first resistance to the heated pressurized gas stream flow inherent in the gas handling system and a second resistance to gas flow resulting from the structure of the powder bed wherein after achieving initial fluidization of the powder bed, the heated pressurized gas stream flow rate is further adjusted to achieve stable fluidization of the powder bed without causing the powder to become entrained in the gas stream.

7. The method of claim 1, wherein the agitating and heating the powder step further comprises achieving stable fluidization of the powder by altering the crystal structure of the powder.

8. The method of claim 1, further comprising removing the heated pressurized gas stream from the vessel via vessel at least one atmospheric vent.

9. The method of claim 1, further comprising removing the agitated and heated powder from the vessel via an outlet portal.

* * * * *